United States Patent
Seol

Patent Number: 6,084,456
Date of Patent: Jul. 4, 2000

[54] SCHMIDT TRIGGER CIRCUIT

[75] Inventor: Wook Seol, Kyoungki-do, Rep. of Korea

[73] Assignee: Hyundai Electronics Industries Co., Ltd., Ichon-shi, Rep. of Korea

[21] Appl. No.: 09/223,385

[22] Filed: Dec. 30, 1998

[30] Foreign Application Priority Data

Dec. 30, 1997 [KR] Rep. of Korea ............... 97- 77846

[51] Int. Cl.[7] .................................................. H03K 03/037
[52] U.S. Cl. ............................................................ 327/206
[58] Field of Search .................................. 327/206, 205, 327/68, 74

[56] References Cited

U.S. PATENT DOCUMENTS

| | | | |
|---|---|---|---|
| 4,295,062 | 10/1981 | Mihalich et al. | 327/206 |
| 4,392,066 | 7/1983 | Hirao | 327/206 |
| 4,563,594 | 1/1986 | Koyama | 327/206 |
| 4,719,367 | 1/1988 | Denda | 327/206 |
| 4,812,676 | 3/1989 | Yang et al. | 327/206 |
| 4,816,702 | 3/1989 | Salina et al. | 326/71 |
| 4,897,569 | 1/1990 | Calzi | 327/206 |
| 5,397,946 | 3/1995 | Truong et al. | 327/74 |
| 5,477,172 | 12/1995 | Schnizlein | 327/99 |
| 5,949,265 | 9/1999 | Bracchitta et al. | 327/206 |

FOREIGN PATENT DOCUMENTS

| | | | |
|---|---|---|---|
| 59-208925 | 11/1984 | Japan | 327/206 |
| 63-31210 | 2/1988 | Japan | 327/206 |
| 63-121193 | 5/1988 | Japan . | |
| 63-187816 | 8/1988 | Japan . | |
| 1-277019 | 11/1989 | Japan . | |
| 5-299981 | 11/1993 | Japan . | |
| 7-176998 | 7/1995 | Japan . | |

*Primary Examiner*—Toan Tran
*Attorney, Agent, or Firm*—Jacobson, Price, Holman & Stern, PLLC

[57] ABSTRACT

A schmidt trigger circuit capable of realizing stabilized output signals and a low-voltage/high-speed process includes an input unit for inverting input signals to output the signals to a first node and a second node; a buffering-inversion unit for sensing levels of the signals from the first and second nodes, buffering and inverting each of the signals and outputting the signals to a third node and a fourth node; and an output unit for latching each of the signals provided from the third and fourth nodes and outputting a final output signal, wherein the input unit consists of a first pull-up module connected between supply voltage and the first node, for pulling up the first node in response to the input signal; a first pull-down module connected between the second node and ground power, for pulling down the second node in response to the input signal; and a resistance module connected between the first and second nodes, to operate so that the signals of the first and second nodes respectively have different delay time from each other.

8 Claims, 5 Drawing Sheets

6,084,456

SCHMIDT TRIGGER CIRCUIT

FIELD OF THE INVENTION

The present invention relates to a digital circuit; and, more particularly, to a schmidt trigger circuit for transforming input waveform into rectangular waveform by using a hysteresis characteristic.

DESCRIPTION OF THE PRIOR ART

FIGS. 1 and 2 provide conventional schmidt trigger circuits. The circuit in FIG. 1 based on one conventional embodiment is composed of an input unit 1 including input CMOS (Complementary Metal Oxide Semiconductor) inverters; an output unit 2 including CMOS inverters, for generating output signals OUTs; and a PMOS transistor P3 (hereinafter, referred to as 'P3') and an NMOS transistor N3 (hereinafter, referred to as 'N3'), which control signals transferred from the input unit 1 and to the output unit 2. The input unit 1 consists of two PMOS transistors (hereinafter, referred to as 'P1' and 'P2') and two NMOS transistors (hereinafter, referred to as 'N2' and 'N1'), which are connected in series between supply voltage and ground power. Herewith, P3 is connected to P1 in parallel, to receive an output signal OUT through its gate, and N3 is connected to N1 in parallel, to receive an output signal OUT via its gate.

When an input signal IN is getting changed gradually from a "low" state to a "high" state or from a "high" state to a "low" state, resistance ratios of the inverters making up the input unit 1 are changed by P3 and N3 controlled by the output unit 2. That is, respectively different threshold voltage is provided to thus generate a hysteresis characteristic, when the input signal IN is changed from "low" to "high" or from "high" to "low".

In the circuit of FIG. 2 based on another conventional embodiment, its basic operation principle is same as the above and only the construction of the circuit is different from one conventional embodiment in a view that P3 for changing the resistance ratio of the input unit 1 is connected to the ground power and N3 is connected to the supply voltage.

In such conventional schmidt trigger circuit, an execution for a low-voltage/high-speed process is difficult since the input unit is constructed by four MOS transistors connected with one another in series, and a sensitiveness is caused in a process since threshold voltage of the circuit may be changed by an on-resistance of the PMOS transistors P1 and P2 and the NMOS transistors N1 and N2 when electric current flows from a "high" state to a "low" state through the input unit.

SUMMARY OF THE INVENTION

It is, therefore, a primary object of the invention to provide a schmidt trigger circuit capable of attaining stabilized output signals and a low-voltage/high-speed process.

In accordance with the present invention for achieving the above object, a schmidt trigger circuit includes an input unit for inverting input signals to output the signals to a first node and a second node; a buffering unit for sensing levels of the signals from the first and second nodes, buffering and inverting each of the signals and outputting the signals to a third node and a fourth node; and an output unit for latching each of the signals provided from the third and fourth nodes and outputting a final output signal, wherein the input unit consists of a first pull-up module connected between supply voltage and the first node, for pulling up the first node in response to the input signal; a first pull-down module connected between the second node and ground power, for pulling down the second node in response to the input signal; and a resistance module connected between the first and second nodes, to operate so that the signals of the first and second nodes respectively have different delay time from each other.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

The present invention is described in detail as follows, referring to the accompanying drawings.

Figure 1:
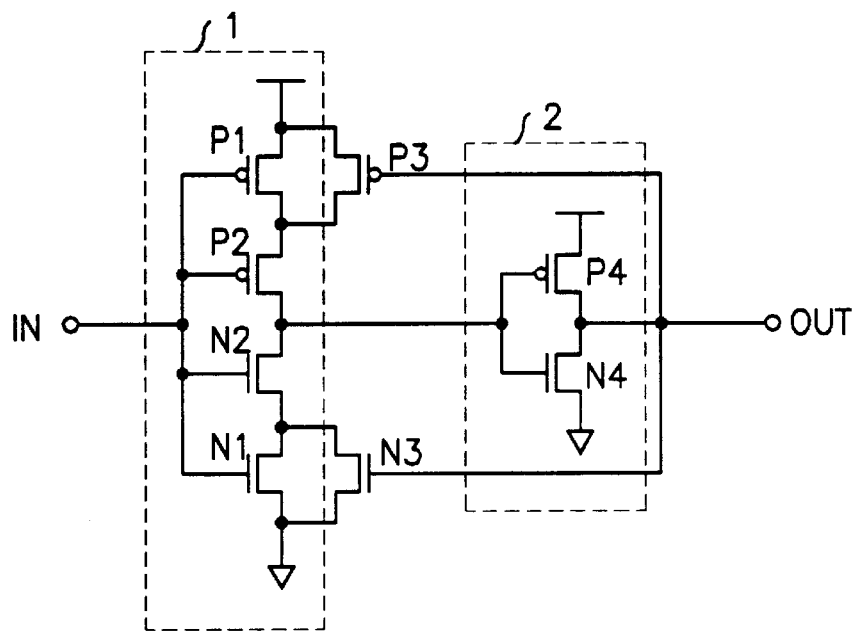
FIGS. 1 and 2 show circuit diagrams illustrating a conventional schmidt trigger circuit.
Figure 2:
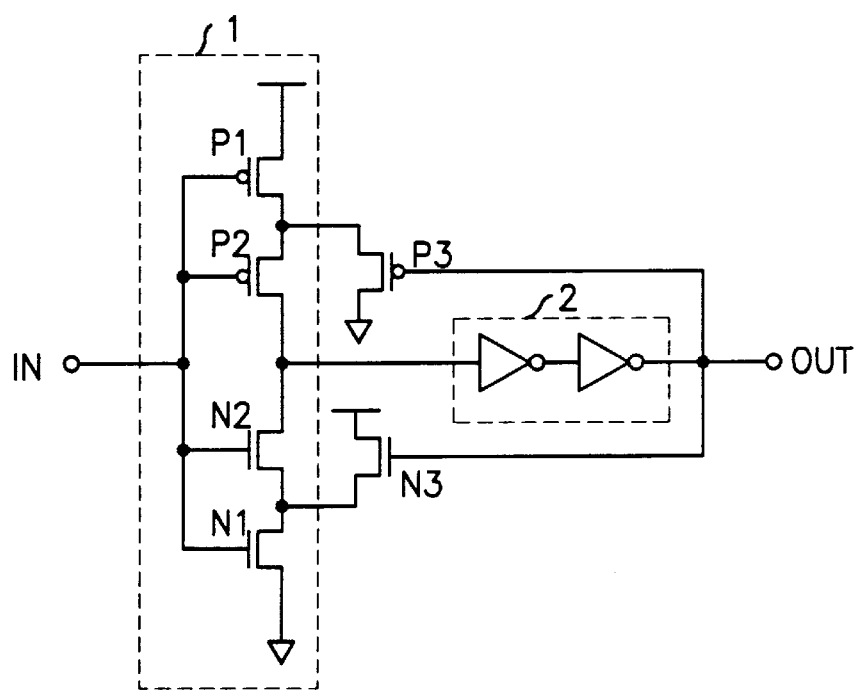
Figure 3:
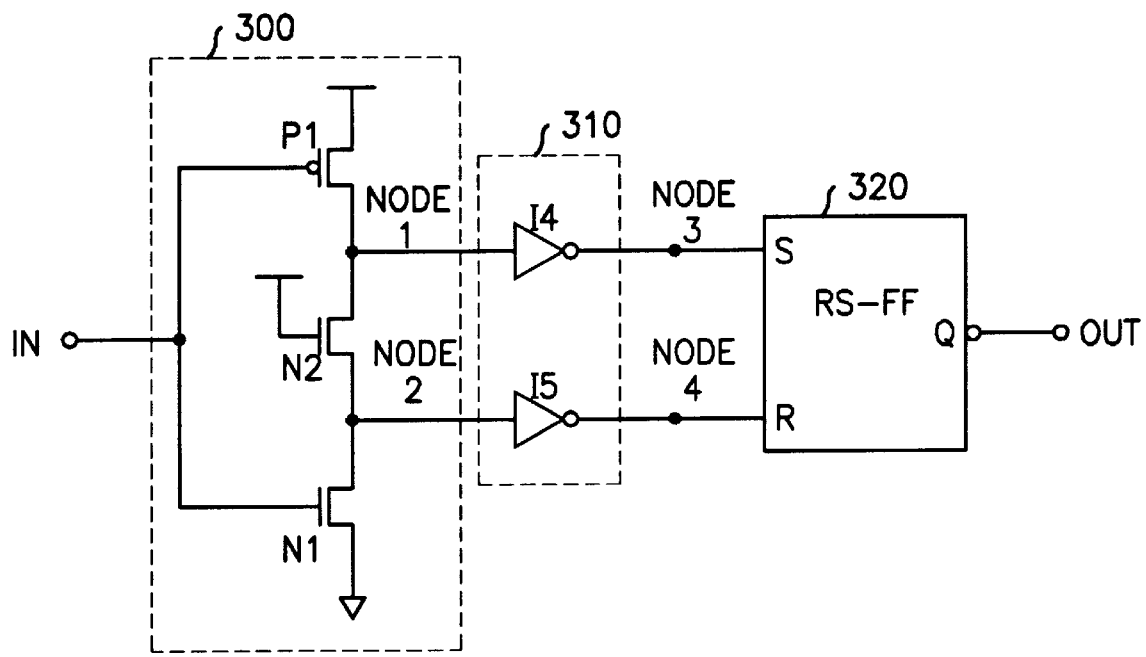
FIG. 3 illustrates a circuit diagram providing a schmidt trigger circuit in accordance with the present invention.

With reference to FIG. 3 showing an inventive schmidt trigger circuit, the circuit is constructed by an input unit 300 for receiving input signals INs, a buffering-inversion unit 310 for sensing levels of signals outputted from the input unit 300 and simultaneously performing a buffering operation, and an RS flip-flop (RS-FF) 320 for latching each of outputs from the buffering-inversion unit 310 to then provide a final output.

Differently from a conventional technique, the inventive input unit 300 has the construction of three stages, namely a PMOS transistor P1, an NMOS transistor N2 and an NMOS transistor N1, which are connected with one another in series between supply voltage and ground power. The PMOS transistor P1 and the NMOS transistor N1 receive each of the input signals INs through their own respective gates and provide a formation of inverters. The NMOS transistor N2 to which the supply voltage is inputted through its own gate, forms MOS resistance to thereby make output nodes 1 and 2 of the input unit 300 each have different delay time from each other at any time.

The buffering-inversion unit 310 is made up of two inverters I4 and I5 for receiving each of inputs from the nodes 1 and 2 and respectively outputting the inputs to nodes 3 and 4.

Figure 4:
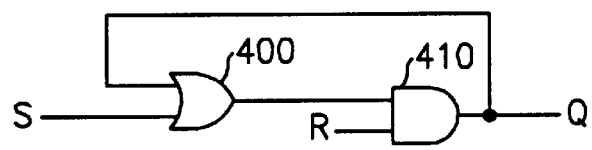
FIG. 4 depicts an interior circuit diagram of an RS-flip flop (RS-FF)

FIG. 4 illustrates an interior circuit of the RS-FF 320, and the RS-FF 320 is composed of an OR gate 400 for logically summing up an input S as a signal of the node 3 and a signal of a feedback output value Q, and an AND gate 410 for performing a logical product for an output of the OR gate 400 and an input R as a signal of the node 4, to generate the output value Q. This generated output value Q is inverted to be then outputted as a final output signal OUT. That is, the RS-FF 320 receives, as each of the inputs S and R, the signals of the nodes 3 and 4, and generates output waveform based on an operational characteristic correspondingly to a rising signal of the node 3 and a falling signal of the node 4.

Figure 5A:
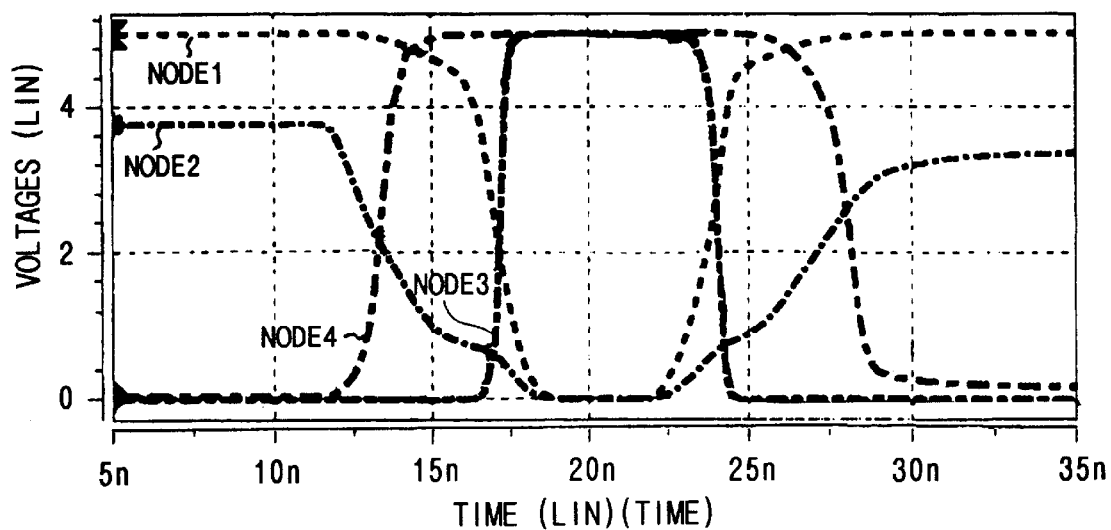
FIGS. 5a and 5b represent a waveform diagram resulting from an inventive circuit simulated.
Figure 5B:
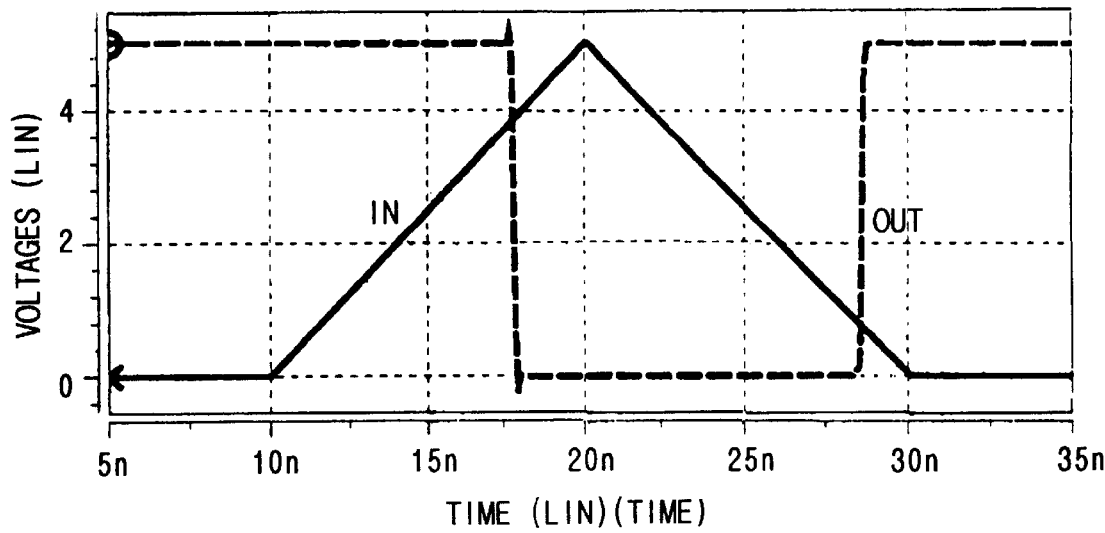

Describing an inventive operational principle referring to FIGS. 5a and 5b showing diagrams of waveform resulting from an inventive circuit simulated, when the input signal IN of a gradually increased state from "low" to "high" is inputted, P1 goes to a turning-off state slowly, on the contrary N1 goes to a turning-on state slowly. Then a signal of the node 1 is transited from a "high" state to a "low" state, and a signal of the node 2 is also transited from "high" to "low". At this time, the transited time point of the node 2 is prior to that of the node 1 by an influence of N2 forming the MOS resistance. Accordingly, there is more time difference between signals of the nodes 3, 4 provided by threshold voltage of the inverters I4, I5 of the buffering-inversion unit. Finally, at a point of the time when the signal of the node 3 is transited from "low" to "high", a transition of an output signal OUT, namely from "high" to "low", is executed, and its "low" value is maintained for a constant time.

Meantime, when a "high" state of the input signal IN slowly becomes a "low" state, P1 goes to the turning-on state to increase signals of the nodes 1, 2 to "high" and N1 slowly goes to the turning-off state. Thus, a rise transition time of the node 1 is prior to a point of a rise transition time of the node 2 by an influence of N2, oppositely to the abovementioned case. Accordingly, the transition time of signals of the nodes 3, 4 is different each other, wherein the signals are inputted to the RS-FF 320 through the inverters I4 and I5. Finally, a transition of an output signal OUT, namely from "low" to "high", is performed, at a point of the time when the signal of the node 4 is transited from "high" to "low" through the RS-FF 320.

Figure 6:
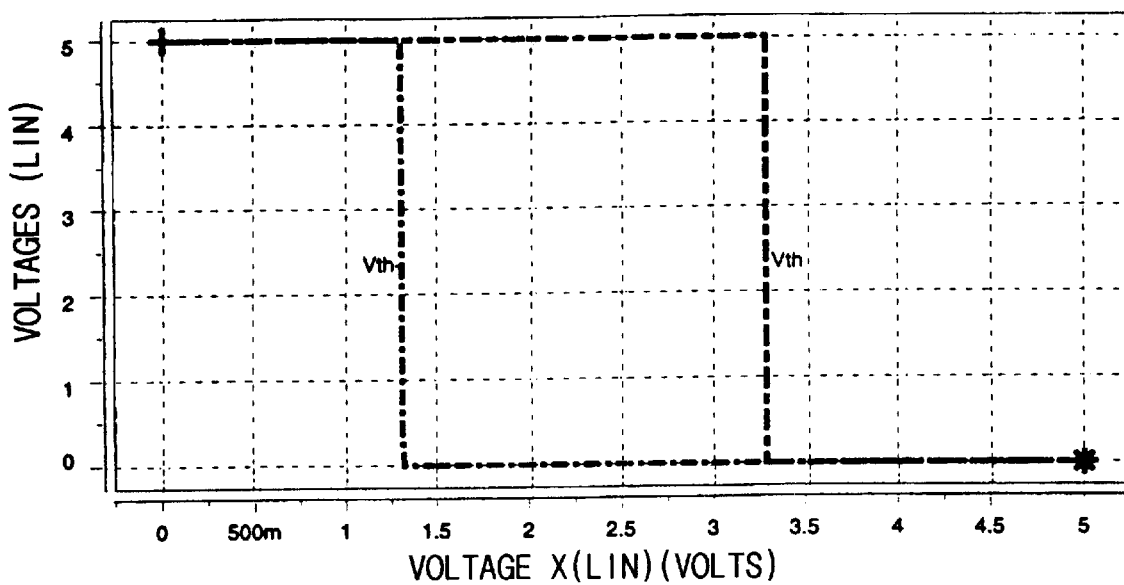
FIG. 6 provides a waveform diagram of threshold voltage in the present invention.

FIG. 6 represents waveform of the threshold voltage in the present invention. In a change of the threshold voltage as a characteristic of the schmidt trigger circuit, in case the input signal IN rises from "low" to "high", there is the threshold voltage by Vth+, and in case that the input signal IN falls from "high" to "low", there is the threshold voltage by Vth−.

It is noted for a reference that the simulation practiced in the present invention was for a case of the same threshold voltage of the inverters I4 and I5.

Figure 7:
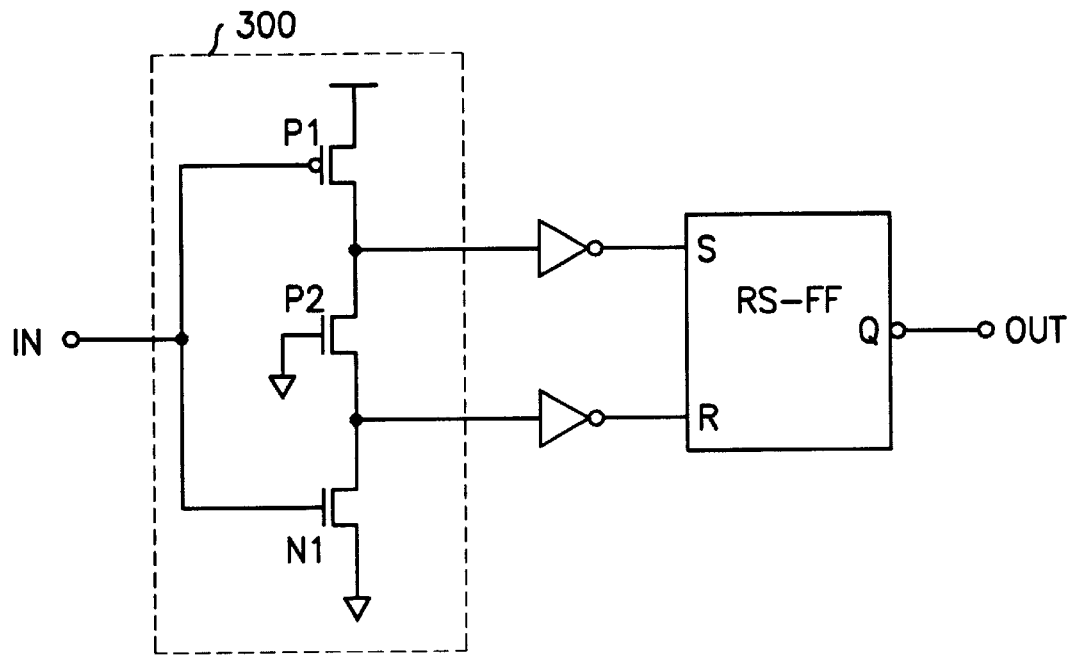
FIGS. 7 and 8 are circuit diagrams providing additional embodiments of the present invention.

FIG. 7 furnishes another embodiment of the present invention, by providing a PMOS transistor P2 whose gate receives the ground power, within the input unit 300, namely as the PMOS transistor forming the MOS resistance. An operational principle of the inventive schmidt trigger circuit by such another embodiment is same as one embodiment afore-mentioned, so the detailed description is here omitted.

Figure 8:
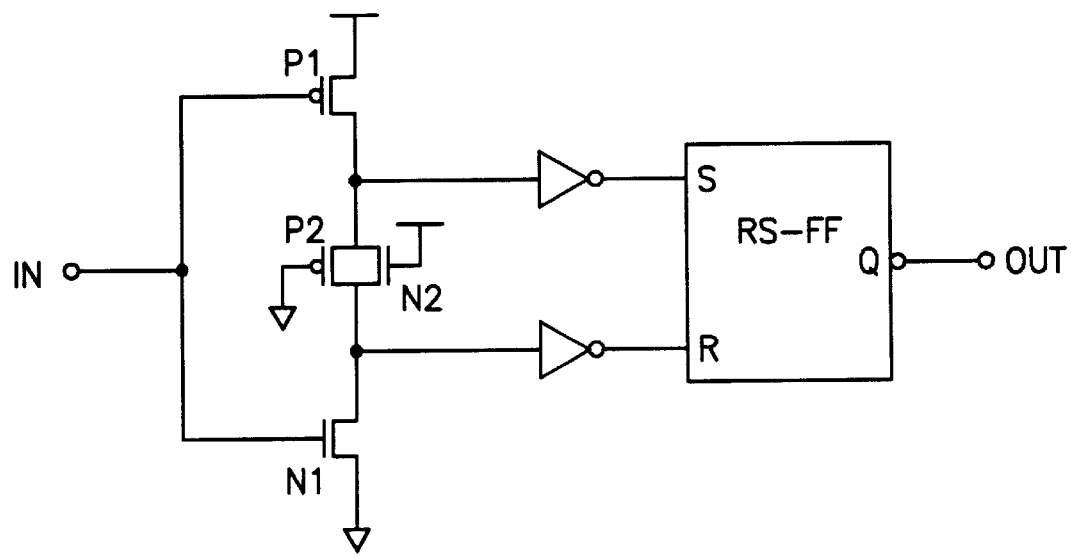

FIG. 8 shows also other embodiment of the present invention, and the inventive schmidt trigger circuit based on such other embodiment is constructed by a PMOS transistor P2 whose gate receives the ground power and an NMOS transistor N2 whose gate has an input of the supply voltage, such transistors being connected in parallel each other. An operational principle of the inventive schmidt trigger circuit by such other embodiment is same as the embodiments afore-mentioned, so the detailed description is here omitted.

The present invention can be applied not only to various kinds of controllers together with micro-controllers, but also to input circuits of all CMOS integrated circuits, further can be applied to a level detector of an input signal.

As afore-mentioned, in accordance with the present invention, the inventive input unit is constructed by three stages differently from the prior art to thereby attain a low-voltage/high-speed process and stabilize output signals by employing the RS-FF in the output unit. Furthermore, a yield improvement can be largely gained since an error occurrent possibility can be lessened by a small influence affected upon a change of a circuit process.

Although the invention has been shown and described with respect to the preferred embodiments, it will be understood by those skilled in the art that various changes and modifications may be made without departing from the spirit and scope of the invention as defined in the following claims.

What is claimed is:

1. A schmidt trigger circuit comprising:

input means for inverting input signals and outputting the signals to a first node and a second node;

buffering means for sensing levels of the signals from said first and second nodes, buffering and inverting each of the signals and outputting the signals to a third node and a fourth node; and output means for latching each of the signals provided from the third and fourth nodes and outputting a final output signal, wherein said input means comprises:
a first pull-up module connected between supply voltage and the first node, for pulling up said first node in response to the input signal;
a first pull-down module connected between the second node and ground power, for pulling down said second node in response to the input signal; and
a resistance module connected between the first and second nodes, said resistance module operating so that the signals of said first and second nodes respectively have different delay time from each other.

2. The schmidt trigger circuit of claim 1, wherein said pull-up module is a PMOS transistor.

3. The schmidt trigger circuit of claim 1, wherein said pull-down module is an NMOS transistor.

4. The schmidt trigger circuit of claim 1, wherein said resistance module is an NMOS transistor whose gate has an input of the supply voltage.

5. The schmidt trigger circuit of claim 1, wherein said resistance module is a PMOS transistor whose gate has an input of the ground power.

6. The schmidt trigger circuit of claim 1, wherein said resistance modules are connected in parallel, and are the PMOS transistor whose gate has the input of the ground power and the NMOS transistor whose gate has an input of the supply voltage.

7. The schmidt trigger circuit of claim 1, wherein said output means generates waveform of said output signal in response to a rising signal of the third node and a falling signal of the fourth node.

8. The schmidt trigger circuit of claim 7, wherein said output means is an RS-flip flop having a first logical module and a second logical module, said first logical module being for receiving and logically summing up the signal of said third node and the final output signal feedback, and said second logical module receiving an output from said first logical module and the signal of said fourth node, performing a logical product for them and generating the output value.

\* \* \* \* \*